United States Patent
Leunissen et al.

(10) Patent No.: US 7,838,209 B2
(45) Date of Patent: Nov. 23, 2010

(54) METHOD OF REDUCING THE IMPACT OF STRAY LIGHT DURING OPTICAL LITHOGRAPHY, DEVICES OBTAINED THEREOF AND MASKS USED THEREWITH

(75) Inventors: Peter Leunissen, Hamme-Mille (BE); Young-Chang Kim, Leuven (BE)

(73) Assignee: IMEC (BE)

( * ) Notice: Subject to any disclaimer, the term of this patent is extended or adjusted under 35 U.S.C. 154(b) by 1046 days.

(21) Appl. No.: 11/185,539

(22) Filed: Jul. 20, 2005

(65) Prior Publication Data
US 2006/0019179 A1    Jan. 26, 2006

Related U.S. Application Data

(60) Provisional application No. 60/589,619, filed on Jul. 20, 2004.

(30) Foreign Application Priority Data
Oct. 1, 2004    (EP)    ................. 04023455

(51) Int. Cl.
*G03C 5/00*    (2006.01)
*G03F 1/00*    (2006.01)
*G03F 7/00*    (2006.01)

(52) U.S. Cl. ............................ 430/394; 430/5; 430/311

(58) Field of Classification Search ............. 430/5, 430/311, 394; 716/19, 21
See application file for complete search history.

(56) References Cited

U.S. PATENT DOCUMENTS

| | | | |
|---|---|---|---|
| 5,413,898 A * | 5/1995 | Kim et al. ................. 430/325 |
| 5,849,437 A | 12/1998 | Yamazaki et al. |
| 6,613,500 B1 | 9/2003 | Phan et al. |
| 6,803,178 B1 * | 10/2004 | Subramanian et al. ...... 430/394 |
| 2004/0010768 A1 * | 1/2004 | Toublan et al. ............. 716/21 |
| 2004/0053141 A1 | 3/2004 | Pierrat |

FOREIGN PATENT DOCUMENTS

| EP | 0 366 367 A2 | 5/1990 |
|---|---|---|
| EP | 1 385 052 A2 | 1/2004 |

OTHER PUBLICATIONS

European Search Report for Application No. EP 05 01 5415, dated Aug. 30, 2005, 2 pages.

* cited by examiner

*Primary Examiner*—Stephen Rosasco
*Assistant Examiner*—Stewart A Fraser
(74) *Attorney, Agent, or Firm*—Knobbe Martens Olson & Bear LLP

(57) ABSTRACT

A method of reducing the influence of the spread of the transmitted light on the feature size during optical lithography is disclosed. The method comprises at least two irradiation steps. During a first irradiation the resist is exposed with the original mask, i.e., comprising substantially the pattern to be obtained in the layer. Thereafter, without developing the exposed resist, an irradiation with at least one exposure is performed whereby the resist is exposed with a second mask, being at least partly the inverse of the original mask. The exposures of the second irradiation step are defocused compared to the first irradiation.

10 Claims, 13 Drawing Sheets

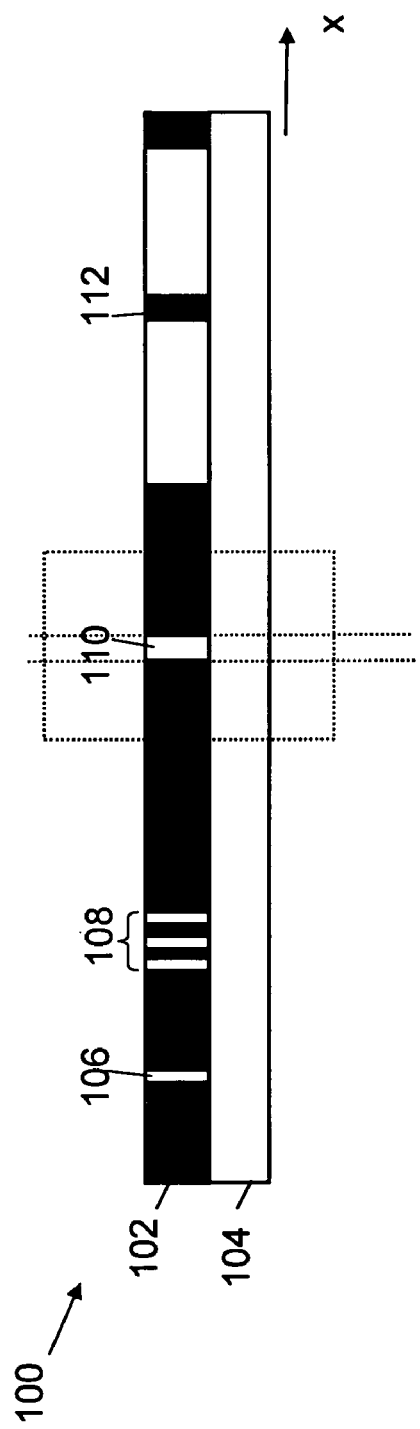
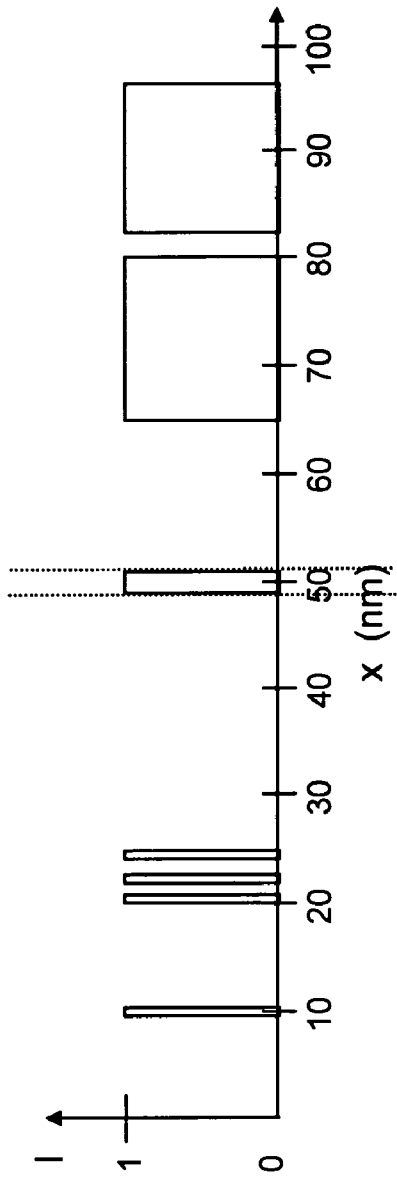
Fig. 1a – PRIOR ART
Fig. 1b – PRIOR ART

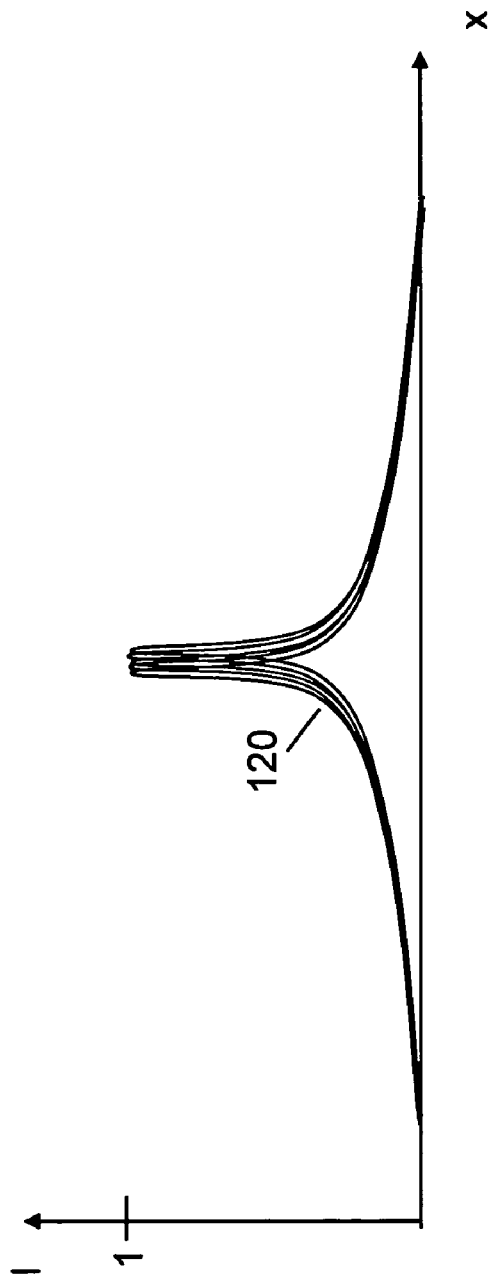
Fig. 1c – PRIOR ART
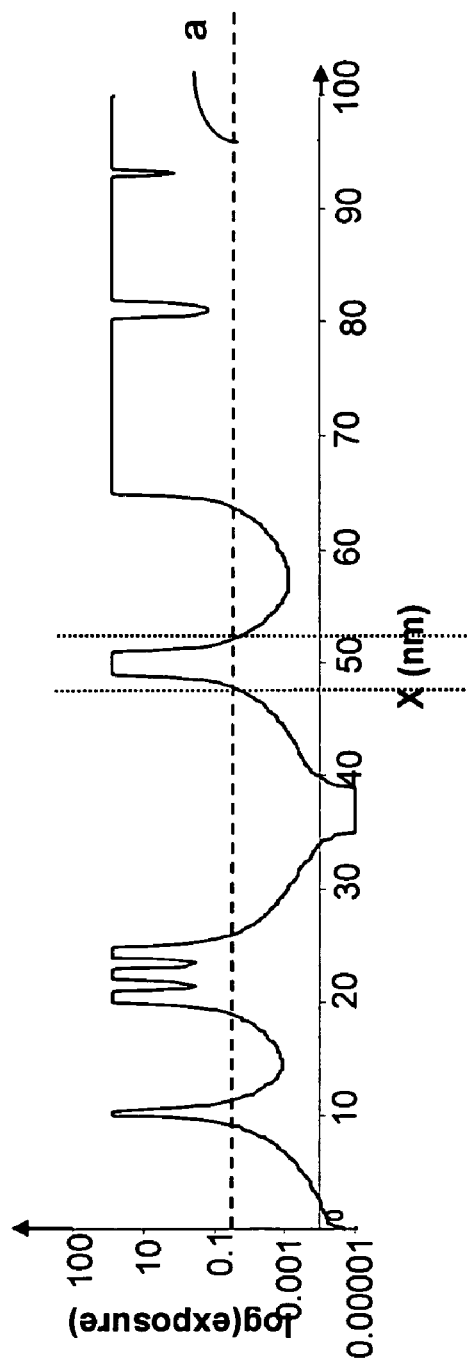
Fig. 1d – PRIOR ART

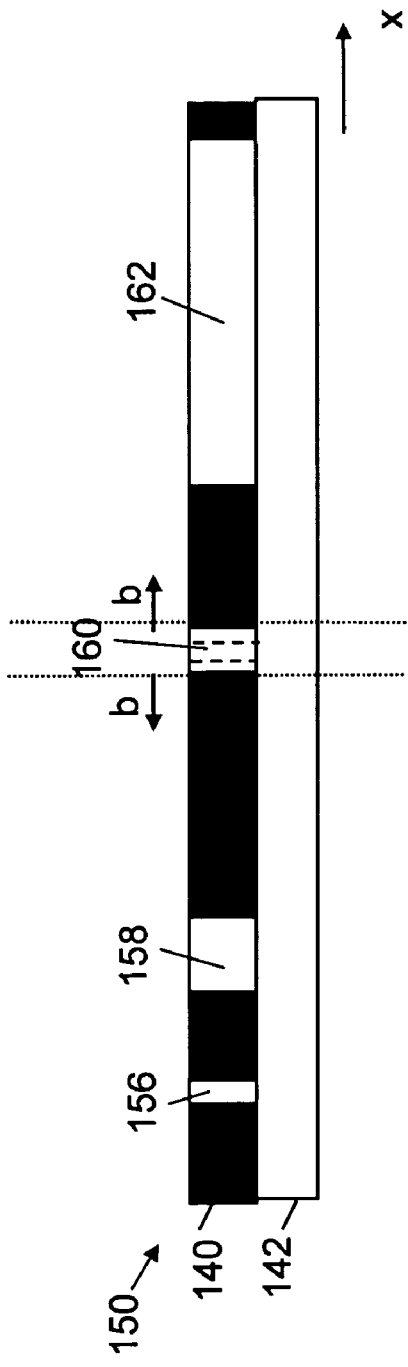
Fig. 1e – PRIOR ART
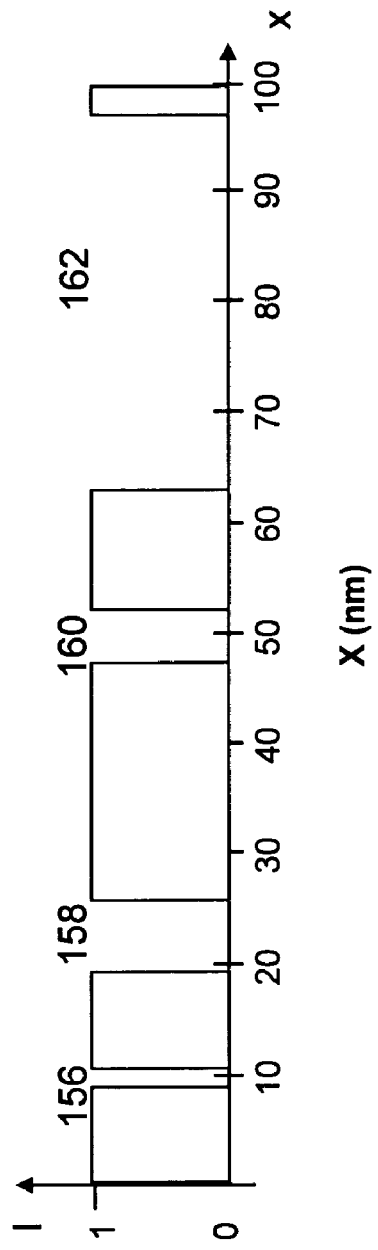
Fig. 1f – PRIOR ART

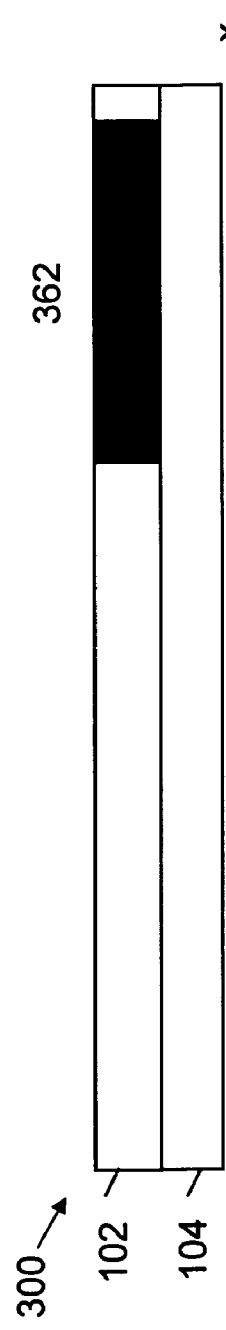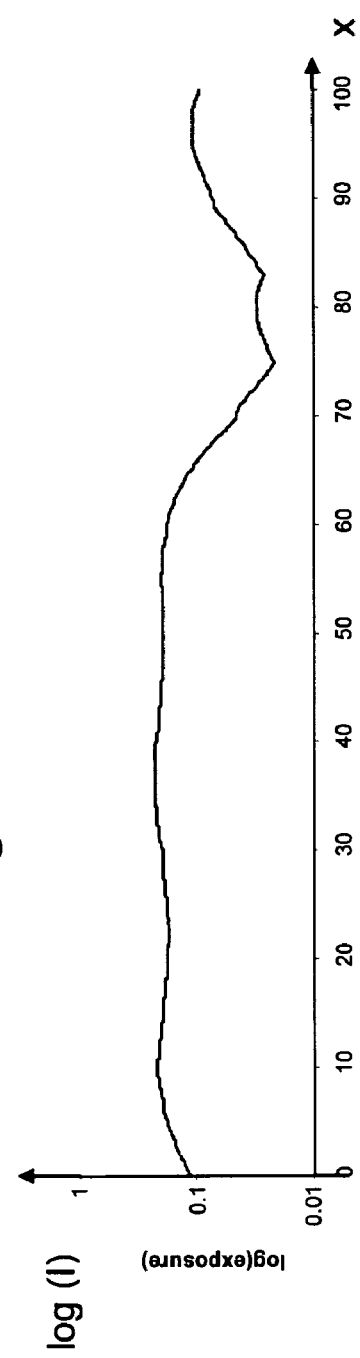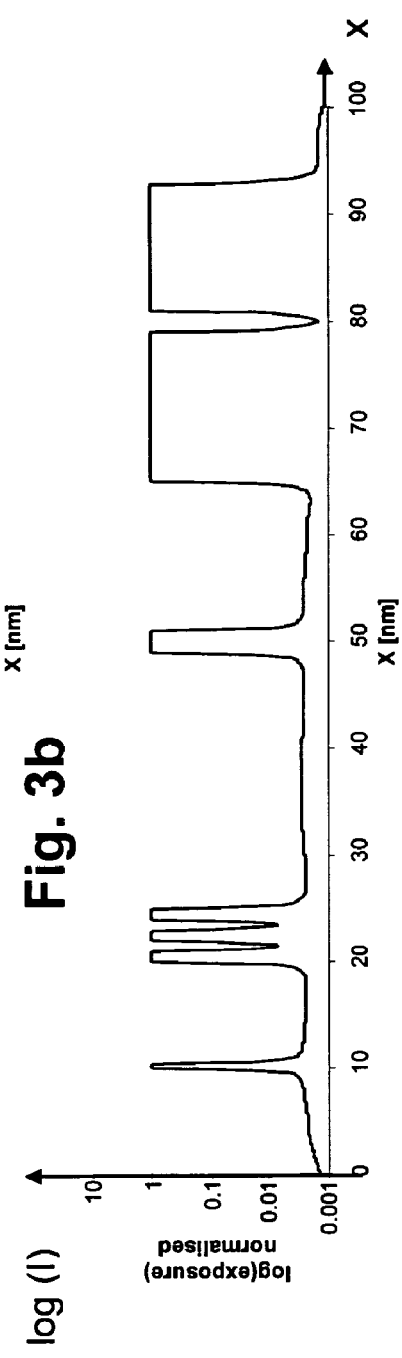

METHOD OF REDUCING THE IMPACT OF STRAY LIGHT DURING OPTICAL LITHOGRAPHY, DEVICES OBTAINED THEREOF AND MASKS USED THEREWITH

RELATED APPLICATION

This application claims the benefit under §119(e) of U.S. provisional application No. 60/589,619 filed Jul. 20, 2004. This application and priority application EP 04023455.1 are incorporated by reference.

TECHNICAL FIELD OF THE INVENTION

The present invention is related to the field of optical lithography used, e.g., in the manufacturing of semiconductor devices such as integrated circuits. In particular, the present invention relates to methods of reducing the impact of stray light on the feature size of devices when creating these devices by optical lithographic processes, to devices thus obtained and to lithographic masks used with these methods for reducing the impact of stray light and the design thereof.

BACKGROUND OF THE INVENTION

During the manufacturing of devices by optical lithography such as semiconductor devices, e.g., integrated circuits on a substrate, areas must be selected on this substrate to allow selective execution of processes thereupon such that the features of the integrated circuits can be defined. Examples of such processes are: introduction in these selected areas of controlled amounts of species to modify the electrical characteristics of the exposed substrate, the removal of material from the substrate in the selected areas by dry or wet etch processes to define a pattern in the substrate, etc. Lithographic processes are used to create these selected areas. A lithographic process comprises several steps.

Firstly, a uniform layer of a photosensitive resin, also known as resist is provided over the substrate. Such resist is commercially available from companies such as Arch (USA), SUMITOMO (Japan), Clariant (Switserland) This resist layer is then selectively exposed to a form of radiation, which modifies the chemical properties of the irradiated portions thereof.

Depending on the wavelength of the radiation used, one distinguishes between optical lithography employing wavelengths above 10 nm, such as 248 nm or 157 nm optical lithography and extreme ultra-violet lithography ("EUV"), on the one hand, and non-optical lithography to which techniques such as electron-beam lithography ("e-beam"), X-ray lithography or ion-beam lithography belong, on the other hand. Typically, a photomask, also known as a mask or reticle, is used to selectively expose the resist layer to this radiation. Such a mask comprises a carrier, formed in a material transparent to the radiation, upon which a pattern is formed in a non-transparent material that, where present, blocks the propagation of light. Hence, this mask pattern will determine where radiation will impinge upon the substrate. Typically a thin chromium layer is used as light-blocking material while fused silica can be used as transparent material, although other light-blocking materials and transparent materials can be used as well.

The mask pattern itself is the material representation of the two-dimensional layout of one layer of the integrated circuit. Such a two-dimensional layout is often referred to as a design. The initial design can be corrected and optionally comprise additional features or size adjustment, which would correct for deficiencies of the lithographic process. By original design is meant that the design as it is being put on the mask. By original mask is meant the mask containing the design, as it should be ideally formed in the resist. In case of positive tone resist, the irradiated portions become more soluble upon irradiation and these exposed portions can be removed selective to the non-exposed regions thereby forming a positive image of the mask pattern. If the non-irradiated regions become dissolvable, i.e., in case of negative tone resist, a negative image of the mask pattern is obtained. The amount of energy necessary to modify the solubility properties of the resist is a characteristic of the resist. This energy threshold can be tuned by selecting the appropriate resist composition.

After the exposure step, the soluble portions of the resist layer are removed and corresponding selected areas are formed in the resist layer through which the underlying substrate is exposed. As a result a pattern of resist is created on the substrate serving as a mask for the processes defining the features of, e.g., the integrated circuit.

The downscaling of semiconductor technology reduces the dimensions of the features of the integrated circuit, e.g., lines, holes, spacing between lines and holes. As these dimensions shrink, it becomes more difficult to define such small features. As a correlation exists between the wavelength of the radiation and the minimal dimension of the selected area—the smaller the wavelength, the smaller the minimal dimension obtainable—and one would use non-optical lithography to obtain dimensions of a nanometer scale. However, these non-optical techniques are very expensive, time-consuming or still require a considerable amount of research and development efforts before becoming production-worthy. Therefore there is a tendency to shift the limits of the well-known optical lithography using R(esolution)-E(nhancement)-T(echniques). For example, U.S. Pat. No. 6,686,102 discusses the problem of defining ever-smaller features by optical lithography and discloses the use of a double-exposure phase shift lithography process.

However, a limit is imposed to the improvement in resolution obtainable by such enhancement techniques as optical lithography suffers from the so-called "stray light" or "flare" effects. "Flare" is an optical effect causing irradiation of the non-selected areas of the resist layer, as light will spread out or will be scattered within the lithographic exposure tool causing the dimensions of the features printed in the resist to change from their desired values. Kafai Li et al. discuss in "Scattered light: the increasing problem for 193 nm exposure tools and beyond", SPIE proceedings vol. 4346 (2001), the origin of stray light and the fact that stray light becomes more and more critical when maximizing the performance of optical lithography systems, especially when using smaller wavelengths.

FIG. 1a to FIG. 1f illustrate the influence of stray light on the dimensions of various patterns to be formed in a layer of resist during optical lithography. FIG. 1a shows a cross-sectional view of a mask 100 comprising a light-blocking layer 102, such as, e.g., a chromium layer, formed upon a transparent carrier 104. The light-blocking layer 102 shown by way of example in FIG. 1a contains a pattern of a small isolated opening 106, a grating 108, i.e., for example a sequence of 3 openings or of 2 lines, an isolated opening 110 and an isolated line 112. FIG. 1b shows, as a function of the position x along the mask 100, for each position whether radiation is being transmitted, represented by an intensity I equal to "1", or is being blocked, represented by an intensity I equal to "0". Such pattern data can be considered as a digital representation of the pattern present in a layer. In the ideal case, the spatial distribution of the radiation leaving each opening within the light-blocking layer 102 can be represented by a point-spread function having a box profile, or mathematically by a Kronecker delta-function. However, in reality the transmitted light will spread out as illustrated for the isolated opening by FIG. 1c. Instead of a box-like point-spread function, a decaying intensity profile 120 of the stray light is obtained which can stretch out over a distance ranging from a few micrometers up to a few hundred micrometers depending on the lithographic system used. Such a decaying point-spread-function is characterised by its decay constant $\lambda$.

After being transmitted by the openings in the mask 100, the transmitted light will impinge upon a substrate 150 comprising a resist or photosensitive layer 140 provided on a layer to be patterned 142 (shown in FIG. 1e). A substrate 150 may include any suitable carrier, such as, e.g., a semiconductor substrate, a glass substrate, a metal substrate, a plastic substrate, etc. Alternatively, a substrate also may include a layer or layer structure on a carrier, such as a device or a circuit on a carrier. The layer 142 to be patterned can also be a part of the carrier material. For the ease of description, it is assumed that the substrate 150, and more specifically the layer 142 to be patterned, is already covered with a photosensitive layer 140. In case of positive tone resist, the pattern of the mask 100 should, in the ideal case, i.e., without flare, be exactly transferred into the resist when the irradiated portions of the resist are removed. In the ideal case the pattern data of the resist, i.e., the information where resist is removed or remains, should match the pattern data of the mask pattern, i.e., where the light blocking layer 102 is present or absent, as through each of these openings light is transmitted in the form of parallel rays towards the resist 140. But, as the transmitted light spreads out, also portions not aligned to the openings in the mask will be irradiated to an extent determined by the decaying light intensity profile of the transmitted light.

FIG. 1d shows the logarithm of the energy absorbed in the resist 140 as function of the position x along the layer 142, while FIG. 1e shows a cross-sectional view of the substrate 150, comprising the positive tone resist 140 overlying layer 142. This view is made after exposure by the pattern of FIG. 1a taking into account the threshold of the resist depicted by the dotted line "a" in FIG. 1d. The threshold of the resist refers to the dose of energy necessary to modify the solubility properties of the resist. In case of the area 156 corresponding with the small isolated opening 106 and the area 160 corresponding with the isolated opening 110, the radiation is spread out over a larger area of the resist 140 thereby resulting in a widening of the resist area which is exposed to radiation. This is indicated by the arrows b for the area 160 corresponding with the isolated opening 110 whereby the dashed lines within this opening indicate its dimension without taking the flare effect into account. In relative terms this effect is more pronounced for the smallest isolated opening 106. In case of the grating 108 or the isolated line 112, the absorbed energy distributions overlap in the corresponding areas 158 respectively 162. The non-exposed region corresponding to isolated line 112 has nearly disappeared as it is overexposed by the flare radiation coming from both large openings at either side of the isolated line 112 in the mask 100. Instead of obtaining a step-like energy profile I in the resist 140, the stray radiation causes this energy profile I to be spread out thereby introducing a background energy dose in the resist 140.

FIG. 1f shows the resulting pattern data in the resist in case positive tone resist is used. A "1" level corresponds to a position which was not exposed and a "0" corresponds to a position where light was absorbed and hence the positive tone resist became soluble. The openings 156, 160 in the resist became larger, the openings of the grating 158 were merged together in one large opening and the single line 112, separating two large openings, has disappeared yielding one large opening 162 in the resist. This deviation in dimension of the resist features (see FIG. 1e) compared to the corresponding features of the mask features (see FIG. 1a) depends on the rate at which transmitted light decays, i.e., the spread of the transmitted light, and on the threshold of the resist, i.e., the amount of light energy required to render the irradiated regions soluble. Mathematically spoken this effect is identical to the convolution of the pattern data of the mask, shown in FIG. 1b, with the point-spread function of the transmitted light, illustrated in FIG. 1c. So flare will result in a deviation of the desired dimensions of the features of the integrated circuit and this stray light will limit the performance of the optical lithography tool.

One way to reduce the impact of stray light on dimension is to reduce the amount of stray light in the optical lithographic tool itself, e.g., by reducing surface roughness or by surface coating. This however requires considerable redesign of the tool.

Another way to solve the dimension or feature size variation induced by flare is to modify the original design and to change the lateral dimensions of the pattern taking into account the induced variation. In the example illustrated by FIG. 1a to FIG. 1f this would imply that the lateral dimensions, i.e., the diameter in case of a circular opening, of the two outer openings would be reduced to an extent determined by the spread of the transmitted light as given by its point spread function. This bias of the lateral dimensions would hence compensate upfront for the later induced variation. However modifying the original design is time consuming and calculation intensive requiring a considerable amount of computer effort. As such small changes in the original feature size necessitate a higher manufacturing accuracy, the manufacturing cost of the mask will increase. Furthermore, although only one exposure step is used, a lithographic process with a higher resolution might be required to allow printing of such slightly modified features and hence the processing cost might increase.

Published U.S. application 2004/0010768 discloses another method for reducing the influence of the spread of the transmitted light on the feature size. The aim of this method is to generate an identical pattern surrounding those features requiring a precise definition of their dimensions, i.e., the "target features", thereby resulting in a reproducible and similar exposure environment for each such target feature. Whereas in the ideal case only one exposure step would be needed using the original mask to form the pattern in the resist, the disclosed method comprises two exposure steps. Each exposure step requires the use of a revised mask, each of these revised masks being a different modification of the original mask. This approach requires two masks and for each mask its suffers from the same disadvantages as the previous method.

SUMMARY OF CERTAIN INVENTIVE ASPECTS

The aim of various inventive aspects is to provide a method for reducing the influence of the spread of the transmitted light on the feature size during optical lithography, which method doesn't suffer from the deficiencies of the prior art, as well as products made with the method and the masks used. Inventive aspects can provide a mask manufacturing accuracy, which is the same or less than the accuracy required for the manufacturing of the original mask.

It is a further aim of various inventive aspects to provide a method for reducing the effect of stray light in optical lithography with a limited mask complexity for the masks used in the optical lithography as well as products made by the method and the masks used.

The above objectives are accomplished by a method, a set of masks and a device according to various inventive aspects. In one embodiment of the invention, a set of two masks is disclosed. The first mask contains the desired pattern while the second mask contains at least a subset of the inverse of this desired pattern or vice versa.

Aspects of the invention relate to a lithographic method for providing a first pattern, i.e., a design, on a substrate, the method comprising the steps of irradiating substantially according to said first pattern, e.g., said design, a photosensitive layer covering said substrate, using at least one optical exposure, correcting said irradiating by irradiating said photosensitive layer according to a second pattern, e.g., according to a correction mask, having at least partly the negative image of said first pattern, e.g., said design. The photosensitive layer may not be developed in between the two irradiating steps. By negative image of a pattern or corresponding therewith of a design it is meant not only that specific areas which are irradiated according to a first pattern or design are specifically not irradiated during irradiation according to the negative image of the first pattern or the negative image of the design but also that specific areas not irradiated according to a first pattern or design are specifically irradiated during irradiation according to the negative image of the first pattern or the negative image of the design. Irradiating substantially according to said first pattern, i.e., said design, may comprise irradiating according to said first pattern, i.e., said design, and it may comprise irradiating according to said first pattern, i.e., said design, completed with features for applying a resolution enhancement technique. Said at least partly the negative image of said first pattern, i.e., said design, may comprise a negative image of at least all features of said first pattern, i.e., said design, having a dimension above a chosen threshold. Said irradiating substantially according to said first pattern, i.e., said design, may be performed with a focus distance $F_1$ and said correcting said irradiating by irradiating according to said second pattern, i.e., according to said correction mask, may be performed with a different focus distance $F_2$. Said threshold may be larger then 0 micrometer. Said chosen threshold may be proportional to a defocus distance $F_2-F_1$. Said defocus distance may be between 0.5 and 20 micrometer, preferably between 1 and 5 micrometer. Said correcting said irradiating by irradiating according to said second pattern, i.e., according to said correction mask, may be performed with an exposure dose $E_2$. Said focus distance $F_2$ and said exposure dose $E_2$ may be determined using a Focus-Exposure-Matrix wafer experiment. Said irradiating substantially according to said first pattern, i.e., design, may be performed using a first irradiation source, said correcting said irradiating by irradiating according to said second pattern, i.e., according to said correction mask, may be performed using a second irradiation source, whereby said first irradiation source has a wavelength smaller than said second irradiation source. Said correcting said irradiating by irradiating according to said second pattern, i.e., according to said correction mask, may comprise multiple exposure steps. Each of said multiple exposure steps may be performed with a focus distance different from a focus distance used during said irradiating substantially according to said first pattern, i.e., design.

Inventive aspects also relate to a device comprising at least one patterned layer, said patterned layer formed according to inventive aspects including any of the methods described above.

Inventive aspects also relate to a set of lithographic masks for use in a lithographic step for providing a first pattern, e.g., design, on a substrate, said set of lithographic masks comprising a first mask and at least one second mask, e.g., at least one correction mask, whereby said first mask is adapted for irradiating a photosensitive resist layer substantially according to said first pattern, i.e., design, and said at least one second mask, e.g., at least one correction mask, is adapted for irradiating said resist layer according to a second pattern, e.g., correction pattern, the second pattern, e.g., correction pattern, having at least partly the negative image of said first pattern, e.g., design. Irradiating substantially according to said first pattern, i.e., design, may comprise irradiating exactly according to said first pattern, i.e., design. Said at least partly the negative image of said first pattern, i.e., design, may comprise the negative or inverted pattern of at least all features of said first pattern, i.e., design, having a dimension above a chosen threshold. The threshold may be larger than 0 micrometer. The threshold may be proportional to a difference in focus distance used during said first and said second irradiation step.

Inventive aspects also relate to the use of a set of lithographic masks as described above on a lithographic tool.

Inventive aspects furthermore relate to a method for designing a set of lithographic masks for providing a design on a substrate, said method comprising designing a first mask consisting of said design and designing a second mask, e.g., a correction mask, comprising at least partly the negative image of said design. Designing a second mask, e.g., a correction mask, comprising at least partly the negative image of said design may comprise completely inverting said design and optionally skipping features with a dimension below a threshold. Said at least partly the negative image of said design thereby may comprise the inverted pattern of at least all features of said design having a dimension above a chosen threshold. The threshold may be larger than 0 micrometer.

Inventive aspects also relate to a computer program product for executing the method of designing as described above. Inventive aspects furthermore relate to a machine readable data storage device storing the computer program product for executing the method of designing a set of lithographic masks, as described above.

It is an advantage of embodiments of the present invention that the mask manufacturing is required with the same or less than the accuracy required for the manufacturing of the original mask.

It is an advantage of the embodiments of the present invention that the technique uses a first mask with a pattern of the features as they are to be provided on the layer, i.e., without applying substantial changes to the original pattern.

It is an advantage of the embodiments of the present invention that the correction mask can be used for a plurality of first masks or on different optical lithographic systems, i.e., without the need to replace the correction or second mask.

Although there has been constant improvement, change and evolution of techniques in this field, the present concepts are believed to represent substantial new and novel improvements, including departures from prior practices, resulting in the provision of more efficient, stable and reliable devices of this nature.

Various inventive aspects permit the design of improved methods and apparatus for performing an optical lithographic process.

These and other characteristics, features and advantages of various inventive aspects invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIG. 1a-FIG. 1f—PRIOR ART illustrates the known effect of flare for an optical lithographic application.

FIG. 3a-FIG. 3c illustrate the second step of a lithographic process according to an embodiment of the present invention.

DESCRIPTION OF VARIOUS ILLUSTRATIVE INVENTIVE EMBODIMENTS

Figure 2A:
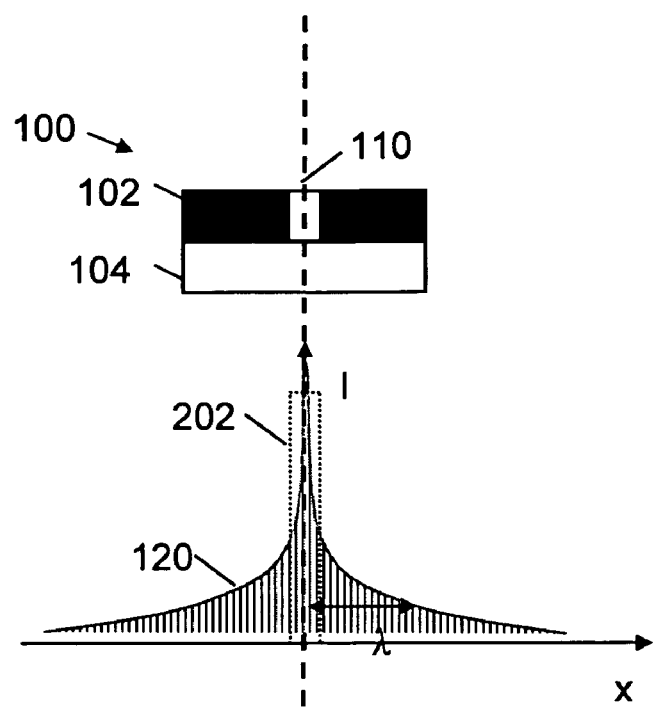
FIG. 2a shows a first irradiation step using substantially the pattern to be obtained on/in the layer for a lithographic method with flare correction according to embodiments of the present invention.

In relation to the drawings embodiments are described below in detail. It is apparent however that a person skilled in the art could develop other embodiments the spirit and scope of the present invention being limited only by the terms of the claims.

The drawings described are only schematic and are non-limiting. In the drawings, the size of some of the elements may be exaggerated and not drawn to scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

For the purpose of teaching the invention a positive tone resist is used, meaning that upon exposure the exposed regions of the resist become soluble and hence the pattern of the mask is transferred to the resist. It will be clear for a person skilled in the art that similar methods, masks and systems can be obtained for application with a negative tone resist.

The present invention may be applied wherever lithography is applied to make a product with a patterned substrate. Although semiconductor processing is a well-known process using such techniques the present invention is not limited only to semiconductor processing.

With the wording negative image of a pattern or inverted pattern, or corresponding therewith a negative image of a design, in the present application there is meant that regions that are light-blocking in a first pattern, or corresponding therewith a first design, become transparent in the inverted pattern or the pattern having the negative image, or corresponding therewith in the inverted design or the design having the negative image and regions that are transparent in a first pattern, or corresponding therewith a first design, become light-blocking in the inverted pattern or the pattern having the negative image, or corresponding therewith in the inverted design or the design having the negative image. Negative image thus in the present application has a similar meaning as it has in photography. As described above, with "design" reference is made to a two-dimensional layout, e.g., a two-dimensional layout of a layer of an integrated circuit. With "correction mask", reference is made to the mask or mask set used during the correction step.

It is to be noted that with "substrate" reference is made to a carrier and a layer which need to be provided with the layout according to the design. Providing a design on/in a substrate thus corresponds with providing a design in a layer which need to be provided with the layout according to a selected design.

A person skilled in the relevant technology will realize that the step of making a mask comprises the steps of generating a design, normally by software means such E(electronic) D(esign) A(utomation) tools provided by companies such as Cadence or Numerical Graphics, both US-based companies or by ASM-L Masktools, a Netherlands-based company. Starting from a given design, a new design can be generated by manipulating the pattern info of this given design by means of software, e.g., varying the dimensions, deleting or adding features, etc. From the design, a mask is manufactured using a lithographic patterning process, the complexity of this patterning process being inversely proportional to the minimal feature size present in the design. The lithographic patterning technique used for the production of lithographic masks preferably is a high quality lithographic technique, which does not suffer from large deficiencies.

Figure 2B:
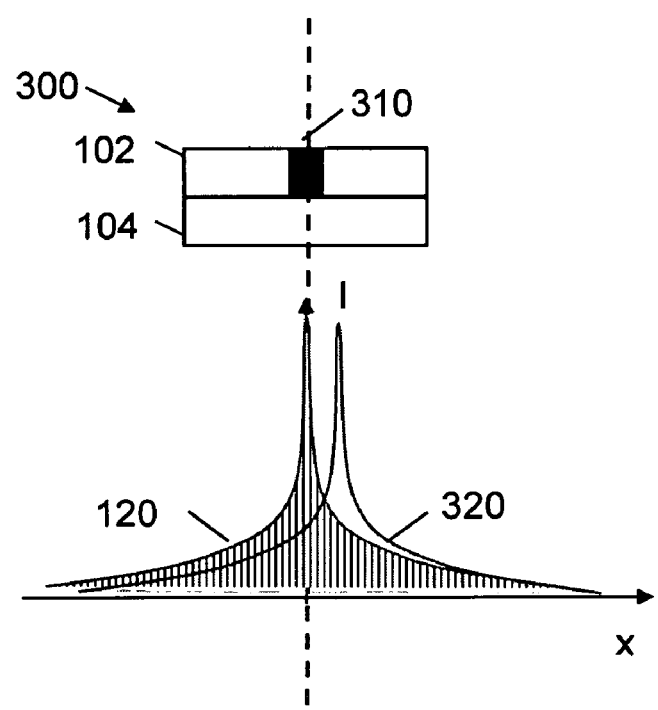
FIG. 2b shows a second irradiation step using the at least partly inverted pattern to be obtained on/in the layer for a method with flare correction according to embodiments of the present invention
Figure 2C:
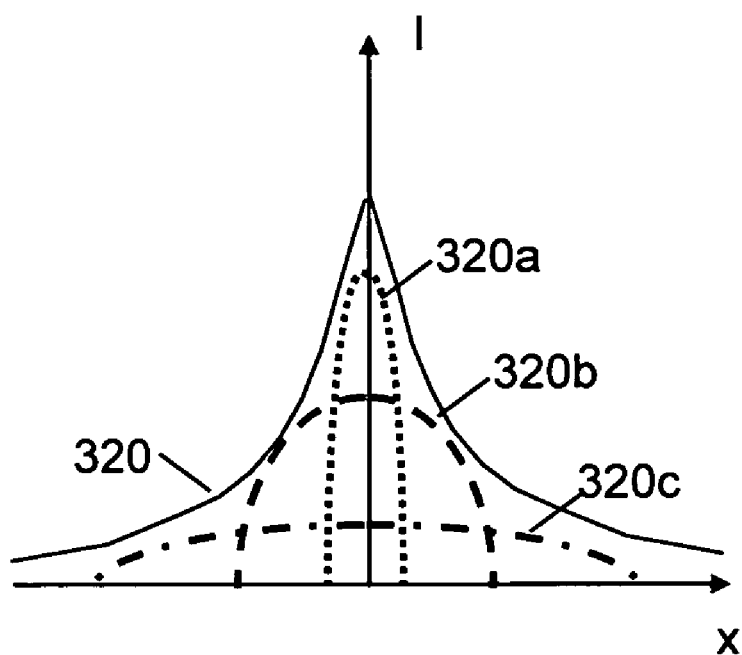
FIG. 2c illustrates an alternative second irradiation step having multiple corrective exposures resulting in irradiation with the at least partly inverted pattern to be obtained on/in the layer for a method with flare correction according to embodiments of the present invention.

FIG. 2a, FIG. 2b and FIG. 2c illustrate the effect of flare on the dimensions to be printed and how this effect can be compensated for according to an embodiment of the present invention. By way of example, compensation will be illustrated for a part of the original mask illustrated in FIG. 1a, i.e., the part located within the dotted area of FIG. 1a. FIG. 2a thus shows a part of an original mask 100 comprising a single isolated opening 110 in the light-blocking layer 102. The light-blocking layer 102 may be made of any type of material that allows blocking of the light used for lithography such as, e.g., a chromium layer. The light-blocking layer 102 typically is deposited on a transparent carrier 104. Alternatively, the mask also could be a solid non-transparent mask having removed portions for the regions that need to be transparent, such as, e.g., a metal mask with removed portions. It is to be noticed that with "original" mask it is meant the mask comprising the pattern or design as it should be created on/in the layer 142 (not shown in FIG. 2a), i.e., on/in the substrate 150, or a Resolution Enhancement Technique mask, i.e., RET-mask, comprising features to improve the resolution of the mask, i.e., allowing smaller features to be printed. These masks are well known by the skilled person in the art.

It is to be noted that RET-masks do not substantially influence the flare effect introduced by the optical lithographic setup nor do they substantially influence the geometrical layout of the pattern. For the purpose of teaching the invention, this isolated opening 110 corresponds with a single pixel (not shown in FIG. 2a, FIG. 2b or FIG. 2c) although a person skilled in the art would realize that a real spacing could be regarded as a two-dimensional array of such pixels. A ray of light would be transmitted through this isolated opening 110 during the exposure of the original mask 100 and, in the ideal case, i.e., not taking into account the finite wavelength or dimensions of a mask, the optical system would be characterized by a point-spread-function in the form of a Kronecker-delta function 202: all light would be confined to the pixel area where a high energy level is present, while outside this pixel area a low energy level, ideally no energy at all, would be present. In real life, diffraction will occur and the transmitted light beam would show a diffraction profile rather than a Kronecker-delta function 202. For the purpose of teaching the invention however the ideal case will be considered.

Due to the flare effect a decaying energy profile 120 is obtained such that regions outside the resist area 160, which are ideally not exposed, will receive energy. Hence instead of having a zero energy level outside the pixel area a decaying energy profile 120 is obtained, whereby the amount of unwanted energy present will depend on the exact pattern of the mask 100, e.g., if dark field or bright field masks are used. This non-uniform background dose will cause changes in the printed dimensions. The extent, to which such changes occur, depends on the lithographic system used and on the tone, i.e., the dark or light field character, of the mask 100. The lithographic system influences the decay of the intensity profile characterized by its decay constant $\lambda$, while the mask tonality influences the energy dose. In case of a dark field mask the flare effect will be minimal, whereas for a light field mask the flare effect will be more pronounced as more light is being transmitted.

The present invention aims to solve this effect by providing a uniform background dose, such that a clear distinction can be made between a region located outside the pixel area having a lower energy level and the pixel area itself having a higher energy level. Selecting the energy threshold a of the resist 140 (not shown in FIG. 2a, FIG. 2b or FIG. 2c) in between this lower and higher energy level is a step of compensating for the effect of flare. FIG. 2b illustrates how a uniform background dose is obtained.

A second mask 300, also referred to as a correction mask 300, is generated as being the opposite tone version of the first mask 100. The isolated opening 110 of this example has become an isolated filling 310. Whereas in FIG. 2a radiation was transmitted at the position of the isolated opening 110, in FIG. 2b radiation will be transmitted all over the mask area except at this position that is now covered with material of the light-blocking layer 102, it is except at the isolated filling 310. This way the normally unexposed resist region outside the pixel area will be deliberately exposed, while at the location of the isolated filling 310 the radiation will be blocked thereby obstructing the direct propagation of radiation to the corresponding location on the layer 140 (not shown).

In order to obtain a uniform energy level outside the pixel area, an energy profile is to be created for the regions outside the pixel area, which is complementary to the energy profile generated during the exposure of the first mask 100. In other words, the point-spread-function of the first exposure step using the first mask 100 is to be imitated, but now for points outside the pixel area. Such point-spread-function 320 is shown in FIG. 2b for a single point. A person skilled in the art would realize that the transparent area of the mask 100 could be regarded as a two-dimensional array of such single points. In FIG. 2b the energy profile 120 created during the first exposure is also indicated. The total energy provided to the resist 140 is the sum of both energy profiles 120, 320. After determining the point-spread-function characteristic for the first exposure step, one can generate a similar point-spread-function 320, to be used during the second irradiation step, by varying the focus of the second irradiation step $F_2$ and the dose of the second irradiation step $E_2$ at which the resist layer 140, (not shown in FIG. 2a, FIG. 2b or FIG. 2c) will be illuminated through the second mask 300. This focus $F_2$ and dose $E_2$ can be also be determined by simulation and/or by routine experimentation. Joseph Kirk, "Scattered light in photolithographic lenses", SPIE proceedings vol. 2197 (1994) p 566-572, discloses the so-called Receding Edge method to determine the impact of flare on line width during illumination of the resist. Alternatively one could also perform a Focus-Exposure-Matrix (FEM) wafer experiment whereby various combinations of focus $F_2$ and exposure dose $E_2$ are screened for the second exposure step and for each combination thereof the resist dimensions are measured.

For some combinations of focus and energy the flare effect will be compensated for during this second irradiation step and hence the desired resist dimensions are obtained. The corresponding focus $F_2$ and exposure dose $E_2$ settings are then to be used during the second exposure step during manufacturing. The latter approach has the advantage that one doesn't need to know or to determine the stray light characteristics itself for a given optical exposure tool, but one can determine the focus and dose of the second irradiation needed to correct for the impact of such stray light in an experimental way. If the second mask 300 is to be used on another optical exposure tool, having other stray light characteristics, a simple experiment is sufficient to determine the settings of the second exposure step to compensate for these other stray light characteristics.

In other words, the impact of scattered or stray light during an optical lithographic process is reduced by executing subsequently two irradiations, without intermediate development. During one irradiation sequence the desired pattern is transferred into the resist 140 or photosensitive layer using at least one optical lithographic process, which irradiation sequence might suffer from flare light. The desired pattern can be a complete structure pattern, i.e., one which if developed without flare would provide the structures desired. In another irradiation sequence performed for correcting the desired pattern from flare, the resist 140 is subjected to another irradiation using at least one optical lithographic process, a result of which a more uniform background energy dose is obtained in the resist 140. Both steps are done one after another, in whatever sequence, but without intermediate development. After executing both irradiations the resist is developed. In order to execute the second irradiation the pattern of the first irradiation is inverted, i.e., light field regions becomes dark field regions and vice versa, and the resist is illuminated according to this inverted pattern.

As indicated in the foregoing paragraph the first irradiation step is done with a first focus $F_1$ and a first dose $E_1$. Preferably this first irradiation is done with the optimal focus $F_1$ and optimal dose $E_1$ of the radiation for the dimension to be printed, as if no flare effect is present. The purpose of this first irradiation step is to print the dimensions as required by the design. A person skilled in the art will know how to determine such optimal exposure conditions for a given dimension to be printed in the resist, e.g., by performing a Focus-Exposure-Matrix (FEM) wafer experiment whereby various combinations of focus and exposure dose are tried and for each combination thereof the resist dimensions are measured.

The second exposure is done with a second focus $F_2$ and a second dose $E_2$. Preferably the second irradiation is defocused compared to the first irradiation; hence the second focus $F_2$ has a value larger than the first focus $F_1$ or $F_2 > F_1$. Typically the defocus of the second exposure step, i.e., $F_2 - F_1$, is between 0.5 and 20 micrometer, preferably between 1 and 5 micrometer. In other words, the second irradiation is defocused with respect to the focus used during the first exposure sequence. The defocus of the second mask will result in a blurring of the transmitted light and an increase of the decay constant $\lambda$. Consequently features having dimensions below a dimension threshold will be overexposed and will not be printed into the resist. As explained in the next paragraph this effect can be exploited to reduce the mask complexity of the second mask 300. As indicated above the purpose of this second irradiation step, and optional, of additional subsequent exposure steps, is to correct for the stray light impinging on the substrate 150.

As will be discussed further in more detail, the second irradiation step may be performed by applying multiple exposures. The latter is illustrated in FIG. 2c, whereby it is shown that the overall point-spread function 320 is built up from different point-spread functions 320a, 320b, 320c obtained by exposing, during the second exposure sequence, the photosensitive layer or resist 140 multiple times using different masks or exposing the photosensitive layer or resist 140 multiple times using the same mask with different conditions. In the same way, the first irradiation step also can be built up by exposing the resist 140 multiple times during the first exposure sequence. The sequence by which these multiple exposures are performed is not limiting for the present application as long as in total a first, possibly multiple, exposure set leads to an irradiation of the resist 140 with the pattern to be obtained in the layer 142, i.e., on/in the substrate 150, and a second, possibly multiple, exposure set leads to an irradiation of the resist 140 with at least partly the negative pattern of the pattern to be obtained in the layer 140.

FIG. 3a and FIG. 3b illustrates how embodiments of the invention may be used to compensate for the flare effect resulting in the widening of the areas 156 and 160 and the vanishing of the lines in areas 158, 162 as illustrated in FIG. 1e.

FIG. 3a shows the opposite tone mask 300 generated by inverting the first mask 100. As explained in the background section (FIG. 1e) and in the description of FIG. 2a, the point-spread-function can stretch out over a distance ranging from a few micrometer up to a few hundred micrometer depending on the lithographic system used. Hence mask features having dimensions small compared to the extension of the point-spread-function do not influence the light distribution towards the underlying resist 140 and the layer 142, i.e., towards the substrate 150. This effect is also illustrated in FIG. 1e, where the isolated line in area 162 has disappeared due to the overexposure through the adjacent transparent regions. The flare effect offers us the option to simplify the opposite tone mask 300. After inverting the first mask 100, all mask features having dimension below a threshold can be removed. The threshold may be larger than 0 micrometer. This removal threshold depends on the decay constant $\lambda$ of the point-spread-function of the second exposure step. This decay constant $\lambda$, and hence the removal threshold, can be correlated to the defocus $F_2 - F_1$ of the second exposure step. If, e.g., this defocus is 1 micrometer, mask features of less than 1 micrometer can be removed. In other words, the inverted pattern used during the second exposure sequence is simplified by removing those features having dimensions below a given threshold. This dimension threshold is determined by the stray light characteristics of the second exposure. If the second exposure is defocused with respect to the first exposure this dimension threshold is at least proportional to the difference in focus used during the respective exposure sequences.

Depending on the purchase price of the second mask 300, one could opt to use a value for the removal threshold, which is smaller, then the defocus, e.g., 250 nanometers instead of 1 micrometer in the example above. Whereas in the example given the second mask 300 would in principle comprise isolated lines or isolated spacings, these inverted features will not be present as their dimensions are small compared to the decay constant $\lambda$ of the point-spread-function. Only a chromium region 362 is present corresponding to the transparent regions defining the isolated line in area 162. Even if another first mask would be used, this other first mask differing from the first mask 100 shown in FIG. 1a by the dimensions and the position of the isolated lines or isolated spacing features or even by comprising additional or less features, e.g., without isolated line features, the second mask 300, i.e., correction mask, shown in FIG. 3a could still be used to correct for the flare effect of this other first mask to the extent that the pattern differences between these two first masks are below the above mentioned dimension threshold. In other words both first masks would yield an identical second mask 300, i.e., second mask, to correct for the flare effect. Hence, embodiments of the present invention allow the use of a single second mask 300, i.e., correction mask, for correcting various designs, only containing differences below the dimension threshold.

FIG. 3b shows the energy profile I of the second exposure. A substantial uniform exposure is obtained, except underneath this chromium region 362 blocking the radiation. FIG. 3c shows the energy distribution I in the resist obtained by combining the energy profile of the first irradiation step shown in FIG. 1d and the energy profile of the second irradiation step shown in FIG. 3b. One can see that the mask features 106, 108, 110, 112 are more accurately transferred to the resist compared the energy distribution of the FIG. 1d. The corresponding resist features are hence better defined.

Figure 4A:
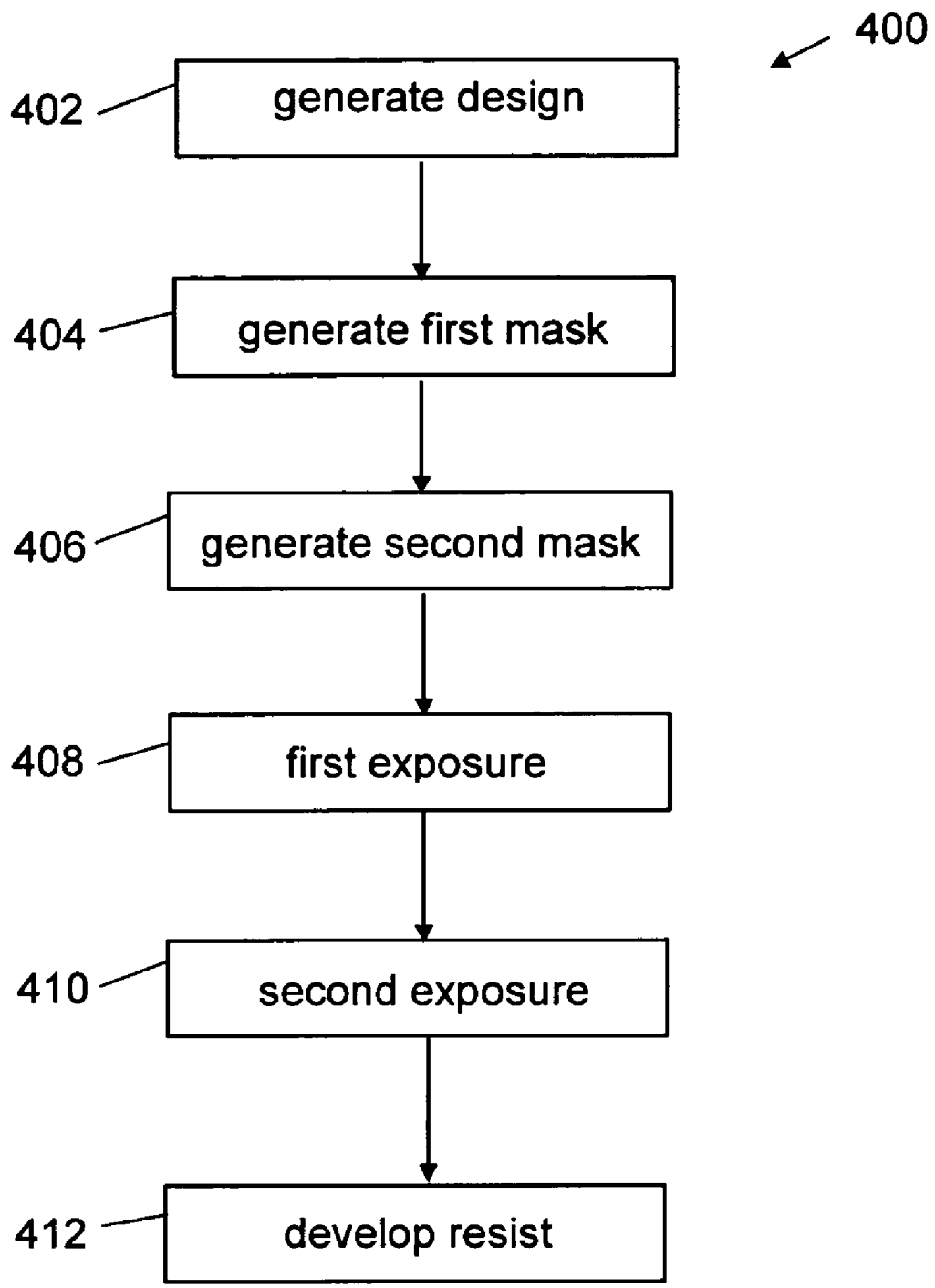
FIG. 4a shows a flowchart outlining a sequence of two irradiating steps according to an embodiment of the present invention.

A method 400 for performing a lithographic step with reduced flare is illustrated in FIG. 4a, showing the different processing steps. After creating the design in step 402, the first mask 100 is generated in step 404. As mentioned before, design of masks typically is done using software means such as E(electronic) D(esign) A(utomation) tools. The first mask 100 can be a binary mask, i.e., only containing the pattern information of the design, or can be a RET-mask. In addition to the pattern information of the design, such a RET-mask comprises features to improve to resolution of the mask, allowing smaller features to be printed. Various types of RET-masks exist. In case of a Phase-Shift-Mask (PSM) the phase of light transmitted adjacent a critical design feature is reverted such that a negative interference at the substrate 150 is obtained thereby cancelling unwanted energy distributions. In case of an Optical-Proximity-Correction-mask (OPC-mask) sub-resolution (sub-lithographic) assist features, being smaller than the smallest design feature, are generated at certain positions, e.g., at corners, to correct for the light distribution at these positions.

An opposite tone version of the design, i.e., the second mask 300, is generated in step 406. As discussed in the section illustrated by FIG. 2b, the second mask 300, i.e., correction mask 300, is derived from the first mask 100 by inverting this first mask 100. Hence on this second mask 300, i.e., correction mask, a pattern of a light-blocking layer 102 is present which is the inverse of the pattern of the light-blocking layer 102 present on this first mask 100. Optionally from this inverted light-blocking layer 102 pattern some features with minimal dimension are deleted thereby reducing the manufacturing complexity of this second mask 300, i.e., correction mask, compared to the first mask 100. In this option the light-blocking layer 102 pattern of the second mask 300, i.e., correction mask, is a subset of the inverted light-blocking layer 102 pattern of the first mask 100.

The layer 142 and the resist 140 thereupon are illuminated using the first mask 100, i.e., in step 408, where after the undeveloped resist 140 is irradiated using the second mask 300, i.e., step 410. Finally, in step 412, the double exposed resist 140 is developed thereby revealing the pattern transferred into this resist. By executing on the resist layer 140 formed upon a layer 142 this combination of a first irradiation step 408 in order to transfer the mask pattern to the resist and of a second exposure step 410 to correct for the flare effect within this resist, a layer of an integrated circuit can be selectively processed. Such a combined irradiation can be repeated for every layer of the integrated circuit when the lithographic patterning of such layer is prone to stray light. Instead of first exposing the first mask 100 and then the second mask 300, one can switch this order by first exposing the second mask 300 and then the first mask 100. A practical limit on the time between successive exposure steps will be imposed by the properties of the resist.

Figure 4B:
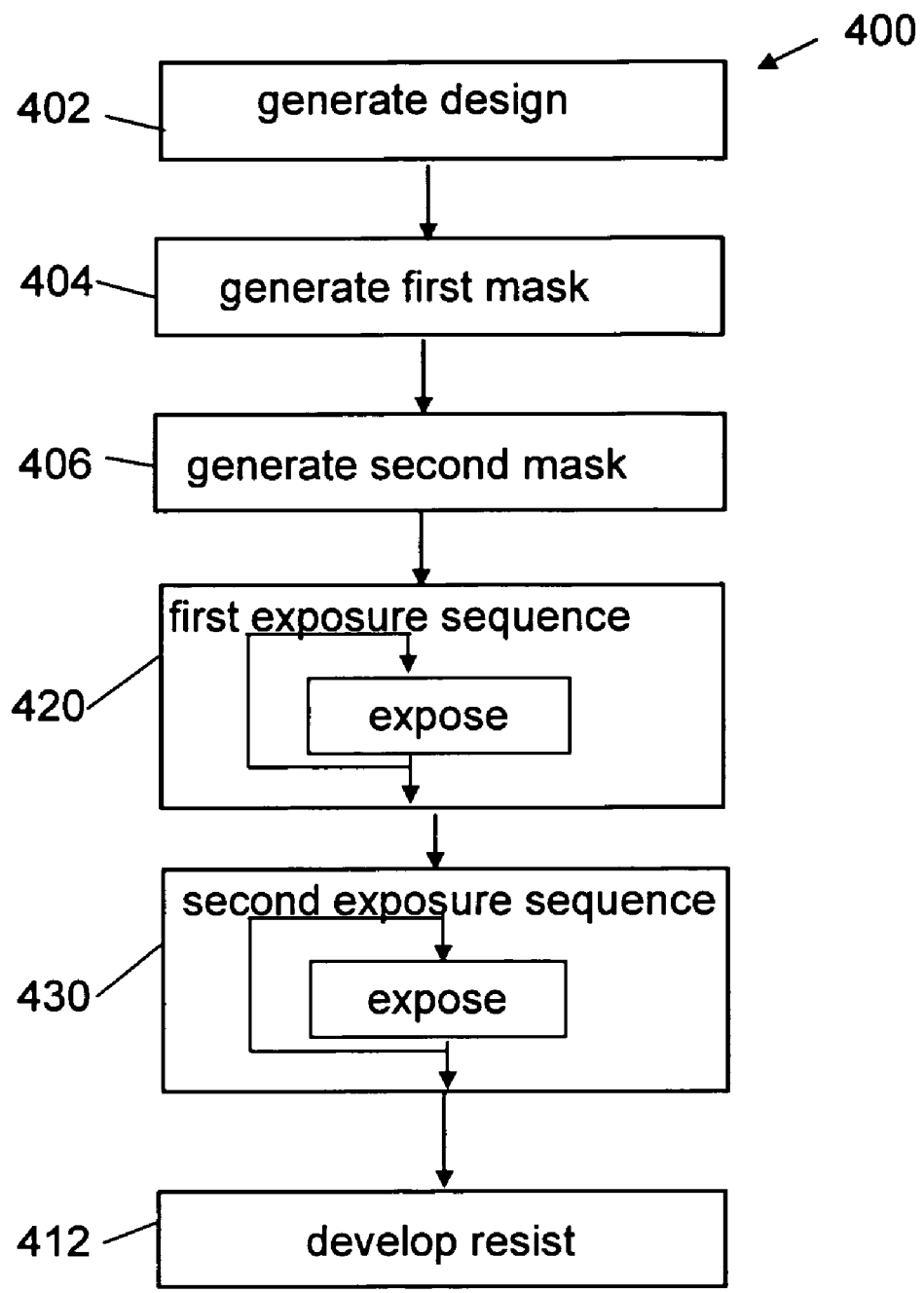
FIG. 4b shows a flowchart outlining another sequence having multiple exposures in one or both of the irradiating steps according to another embodiment of the present invention.

In an alternative embodiment, multiple exposure steps can be performed to generate the desired energy distribution profile I in the resist 140 which will yield after development the desired resist pattern, as illustrated in FIG. 4b for method 400.

Instead of performing a single exposure with the inverted mask 300 to imitate the point-spread-function of the first exposure step, as described by step 410 in FIG. 4a, multiple exposures can be used, shown in step 430, preferably using the same inverted mask 300. Each of these exposures in this second exposure step, i.e., the sequence of the different exposures through the inverted mask, is performed at a focus $F_{2i}$ and energy $E_{2i}$, chosen to generate a specific point-spread-function $320i$, e.g., point-spread-function 320a, 320b, 320c as shown in FIG. 2c. Selection of the different foci and doses can be performed based on educated guesses, by performing test experiments, by trial and error, by calculation, etc. The superposition of these specific point-spread-functions will yield the desired overall corrective point-spread-function 320. Purpose of this second exposure step, i.e., the second exposure sequence, is to generate the desired point-spread-function of the flare correction, which can be approximated, by a combination of individual point-spread-function. This is illustrated by FIG. 2c.

Instead of generating the point-spread-function 320 in a single exposure step as illustrated by FIG. 2b, three exposure steps are performed, each yielding a specific point-spread-function 320a, 320b, 320c such that the superposition of these functions 320a, 320b, 320c results in the desired overall function 320. This multiple exposure approach offers, apart from the focus $F_{2i}$ and the dose $E_{2i}$, an additional degree of freedom to optimise the correction for the flare effect. Optionally one could use several second masks 300, i.e., correction masks, with the same or different focus and energy settings to obtain the desired overall point spread function 320. Optionally one could use several versions of the same second mask 300, e.g., generated with a view to design optimisation of the first mask, each of these versions could be exposed with the same or different focus and energy settings to obtain the desired overall point spread function 320. Also the step of creating the first energy profile I in the resist using the first mask 100 can comprise multiple exposure steps, as shown in FIG. 4b in step 420.

Depending on the dimension of the features to be formed, one can choose to either use a lithographic process capable of forming all features during a single exposure step, or to select a lithographic process to define the smallest features and another lithographic process to define the larger and less critical features. Whereas in the first option, i.e., the single exposure process, the complete pattern information present on the first mask 1, generated in step 404, is used, in the second option, i.e., the multiple exposure process, only a part of this pattern information will be used during each of these exposures of step 420.

In this respect one could use a lithographic process with a short wavelength, e.g., e-beam lithography, to define the critical features and a lithographic process, e.g., 248 nm lithography, to define the less critical features. One could also use different types of masks 1, e.g., an OPC mask to define the critical features and a binary mask to define the less critical features. In one exposure step only that part of the pattern information, containing the smallest and critical features is then used, while the remaining pattern information, containing the larger and hence less critical features, is used during another exposure step in the first exposure sequence, i.e., in the first irradiation step 420. In other words, the pattern of the first exposure sequence can be divided in one subset containing features having minimal dimensions, which are more difficult to print, and in another subset containing features having larger dimensions, which are easier to print. The minimal size subset is then used during a better performing lithographic process, which more accurately prints such small features, while the larger size subset is used during a less performing lithographic process, suitable for printing such larger features, whereby at least one lithographic process is an optical process.

The sequence by which these multiple exposures are performed is not limiting for the present application as long as in total a first, possibly multiple, exposure set leads to an irradiation of the resist 140 with the pattern to be obtained in the layer 142 and a second, possibly multiple, exposure set leads to an irradiation of the resist 140 with at least partly the negative pattern of the pattern to be obtained in the layer 140.

Finally after performing the first exposure sequence 420 and the second exposure sequence 430, the multiple exposed resist 140 is developed thereby revealing the pattern transferred into this resist, i.e., step 412.

In another embodiment of the present invention, in the lithographic tool 500 different radiation sources 502 are used for the subsequent exposure steps. During the first exposure step the original mask 100 is printed onto the resist 140. Because on this original mask 100 the smallest dimensions are present, a radiation source 502 with a small wavelength must be used, as explained in the background section, to transfer such small features from the mask 100 to the layer 142. For a given wavelength, alternative techniques, such as immersion lithography, aims to increase the optical performance of the lithographic tool, such as the numerical aperture (NA) in case of immersion lithography. So this first exposure step might require a more complex and hence expensive optical lithographic technology. For the subsequent, corrective, exposure steps correction masks 300 can be used with more relaxed dimensions, i.e., containing features 504 with dimensions larger than their counterpart features 506 on the original mask 100 as discussed in the foregoing paragraphs. Hence for these additional exposure steps radiation sources 502 providing radiation 508 with a larger optical wavelength can be applied. So this additional exposure steps might require a less complex and hence less expensive optical lithographic technology and corresponding lithographic tools 500.

The only limiting factor determining the choice of the wavelengths is the resist 140 used. This resist 140 must be sensitive to all the wavelengths applied otherwise its chemical properties will not be modified upon radiation as explained in the background section. One could use EUV lithography for the first exposure step and 248 nm for the second exposure step when using a 248 nm-compatible resist. Likewise 193 nm optical lithography could be used for the first exposure step and 157 nm optical lithography for the second exposure step when using appropriate resists.

Table 1 illustrates the compatibility of lithographic processes, which are to be selected for respectively the first exposure step and the second exposure step. The more "+" signs, the better the compatibility while a "−" sign denotes resist incompatibility. In this way, the preferable combinations of optical lithographic process used for the first exposure and lithographic processes used for the second exposure are indicated.

TABLE 1

|  |  | Lithographic process for 1st exposure | | | |
|---|---|---|---|---|---|
|  |  | 248 nm | 193 nm | 157 nm | EUV |
| Lithographic process for 2nd exposure | 248 nm | + | ++ | ++ | +++ |
|  | 193 nm | − | + | ++ | − |
|  | 157 nm | − | − | + | − |
|  | EUV | − | − | + | + |
|  | E-beam | − | − | − | + |

In the previous embodiments transmissive masks 100, 300 are used to transfer the pattern of a design to the resist 140 on a layer 142, a person skilled in the art will appreciate that optical lithographic techniques are available that doesn't require the use of such transmissive masks 100, 300.

Figure 5A:
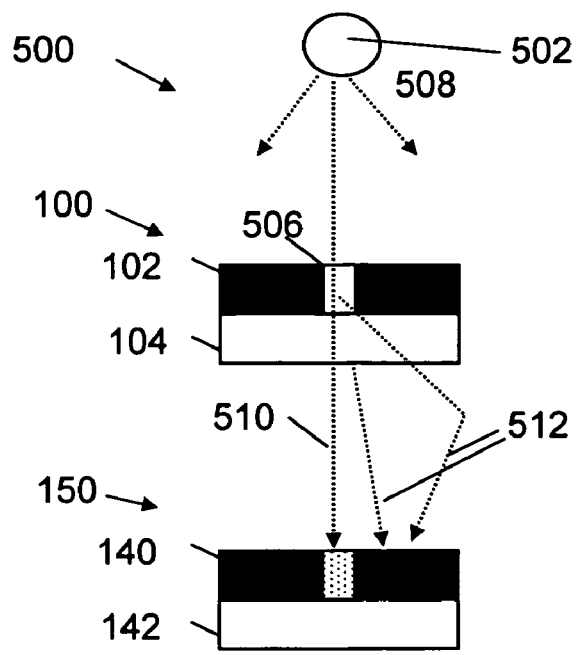
FIG. 5a-FIG. 5b illustrate various methods for transferring of the pattern of a design to the layer according to an embodiment of the present invention: transmissive lithography (a), reflective lithography (b).
Figure 5B:
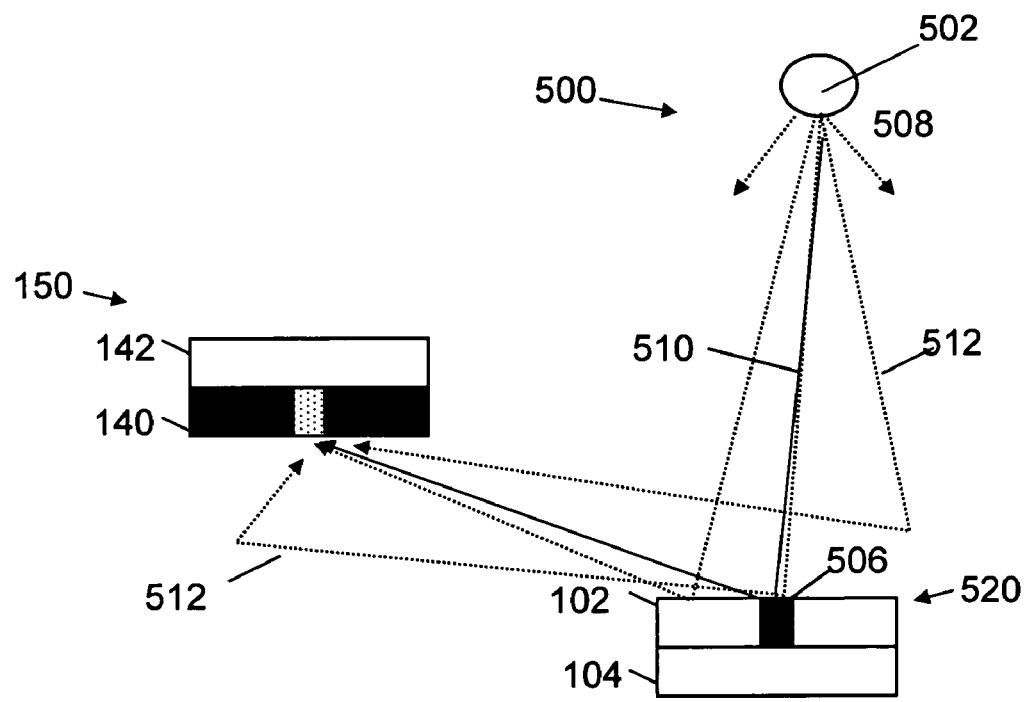

FIG. 5a illustrates the transmissive mask approach. In a lithographic tool 500 a radiation source 502 generates radiation 508, which is transmitted towards the substrate 150 via a mask 100. This mask will contain the pattern information 506 of the design to be printed, in this example a single spacing 506. The transmitted light will impinge directly 510 or indirectly 512, i.e., the stray light, on the substrate 150 and the single spacing 506 is printed (dotted area). FIG. 5b illustrates a reflective mask approach, as is the case for EUV optical lithography. In a lithographic tool 500 a radiation source 502 generates radiation 508, such as, e.g., EUV radiation, which is transmitted to the substrate 150 via an optical system, directing the radiation 508 towards the substrate 150. In this example the radiation 510 is redirected by the reflective mask 520. Also in the reflective mask approach stray light effects might occur as, e.g., radiation 512, which is to be redirected away from the substrate 142, might be scattered towards the substrate 150. Hence, in this patent application by the term exposure is meant the transfer of the pattern information of a design to a resist layer 140 by means of radiation. By the term mask is meant the optical system 520, 100, 300 controlling the incidence of the radiation 508 onto the resist layer 140 upon this layer to be patterned 142 in accordance with the pattern information to be transferred. It will be obvious for the person skilled in the art that during the second irradiation, i.e., during the correction step, the same setup can be used, although the invention is not limited thereto.

A best mode embodiment of the invention is illustrated by FIG. 6a to FIG. 6d, FIG. 7a to FIG. 7c and FIG. 8a to FIG. 8b. First, as illustrated by FIG. 6a to FIG. 6d, the resist 140 is exposed through a first mask 100. Preferably this first mask 100 is an original mask.

Figure 6A:
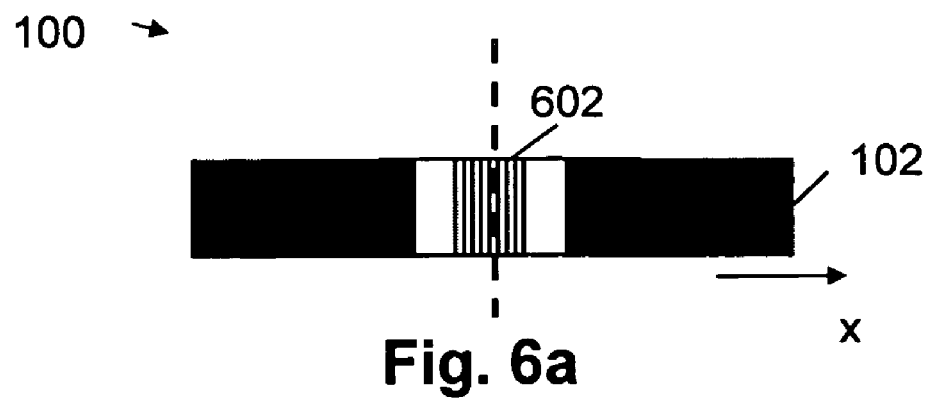
FIG. 6a-FIG. 6d illustrate the first step of a lithographic process according to a best mode embodiment of the invention.

FIG. 6a shows a top view of a dark field mask as a first mask 100 comprising a pattern 602 or corresponding design, i.e., a sequence of 9 lines, formed in the light blocking layer 102, such as, e.g., a chromium layer. A characteristic of a dark field mask is that the background or field of the mask is covered by the light-blocking layer 102 and hence made opaque. FIG. 6c shows a top view of the light field (LF), also called clear field or bright field, version of the mask shown in FIG. 6a. The mask 100 of FIG. 6c comprises the same pattern 602, i.e., a sequence of 9 lines formed in the light-blocking layer 102 of FIG. 6a. By way of example, a pattern 602 is shown representing lines having a width or critical dimension (CD) of 130 nm and a spacing of 130 nm. A characteristic of a light field mask is that the background or field of the mask is not covered by the chromium layer 4) and hence reveal the radiation transparent carrier 104.

Figure 6B:
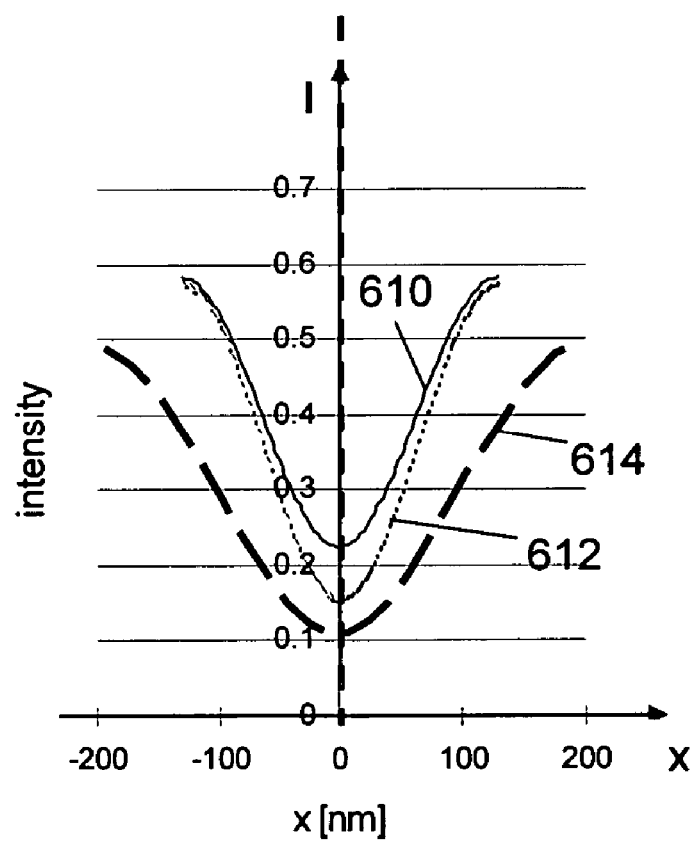
Figure 6C:
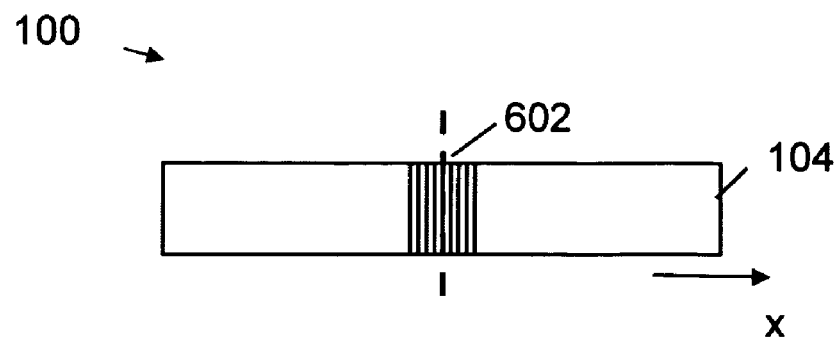

FIG. 6b shows the intensity profile I along the x-axis, i.e., parallel to the first mask 100 and the exposed substrate 150 (not shown), of the light transmitted through the mask 100 and impinging on the underlying substrate 150 (which is not shown). Both the results for a light field mask, indicated by curve 610 (full line), for a dark field mask, indicated by curve 612 (dotted line) are shown and compared to the original light intensity indicated by curve 614 (dashed line), i.e., if no mask is present. This intensity profile I is measured at the centre of the pattern 602 of the mask 100, i.e., at the position of the middle line of the sequence of lines, as indicated by the vertical dotted line on FIG. 6a, FIG. 6b, FIG. 6c. In the ideal case, i.e., without the light diffraction, the intensity profile I of both masks should coincide and be equal to the original light. intensity: at corresponding positions at the surface of the underlying substrate 150 the same amount of light should be received thereby resulting in resist lines with similar dimensions. However as shown in FIG. 6b, due to the polarity of the mask used, i.e., light field (LF) or dark field (DF), the intensity profiles I deviate from each other. Compared to the ideal case illustrated in FIG. 6b by curve 614 (dashed curve), the intensity profile of both the dark field mask indicated by curve 612 (dotted line) and LF mask indicated by 610 (full line) is shifted upwards as more light is being received by the substrate compared to the ideal case. This upwards shift is more pronounced in case of the LF mask, as due to its transparent character the pattern 602, i.e., the sequence of lines, gets overexposed as the amount of received stray light is larger.

Figure 6D:
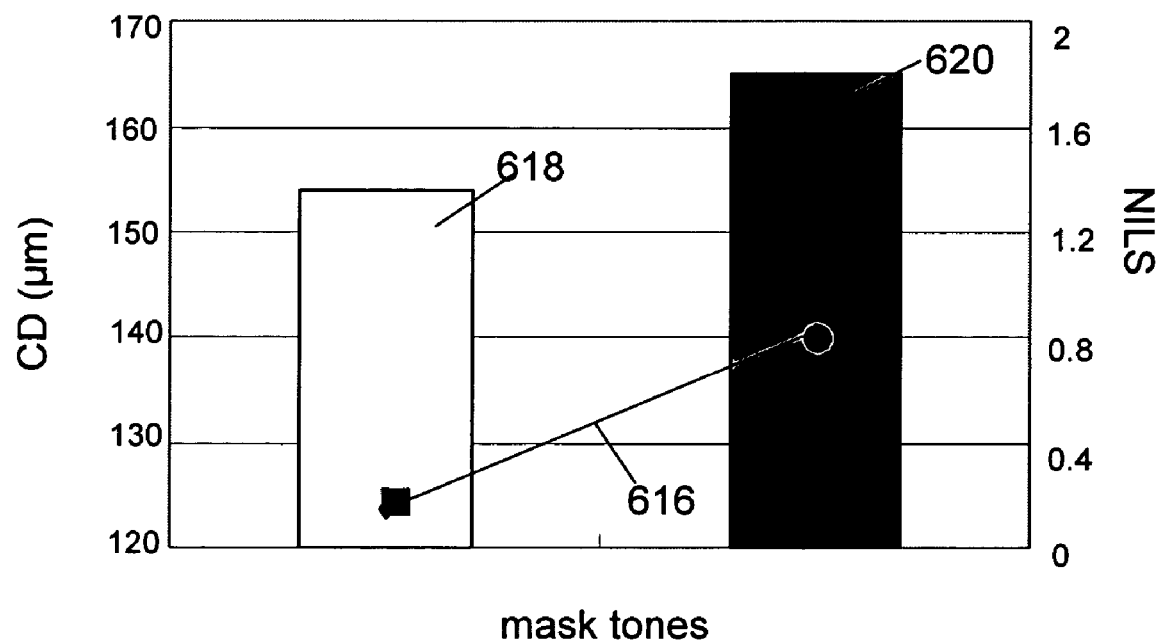

FIG. 6d illustrates the influence of this intensity shift on the dimensions of the lines as printed. The mean value of the width (CD) indicated by curve 616 for the present example of 130 nm lines and spacings on the mask, is about 125 nanometer (nm) (indicated by a square), indicated by histogram 618, 620, with a NILS (Normalized Image Log slope) of about 1.4 for the light field (LF) version, indicated by square 618 with a dotted pattern, while for the dark field (DF) version these numbers are respectively 140 nm (indicated by a circle) and 1.8, indicated by square 620 with a line pattern. The NILS parameter is proportional to the slope of the normalized intensity profile I and therefore is a measure for the sensitivity of the optical system under study to variations in dose and focus of the radiation.

During the previous step, i.e., the first irradiation step, the substrate 150 was exposed a first time at a first focus $F_1$ and a first dose $E_1$ with a first mask 100 having a first polarity. In the next step the substrate 150 will be exposed at least a second time at a predetermined second focus $F_2$ and a second dose $E_2$ with a second mask 300. This second mask 300, i.e., the correction mask 300, is generated by inverting the first mask 100: areas of the carrier 104 which were not covered with light blocking material 102 such as, e.g., chromium, will now be covered, where areas of the carrier 104 which were covered with light blocking material 102, become uncovered. Between these successive exposure steps the resist 140 will not be developed and the resist layer 140 remains uniformly on the layer to be patterned 142, i.e., on the substrate 150.

Figure 7A:
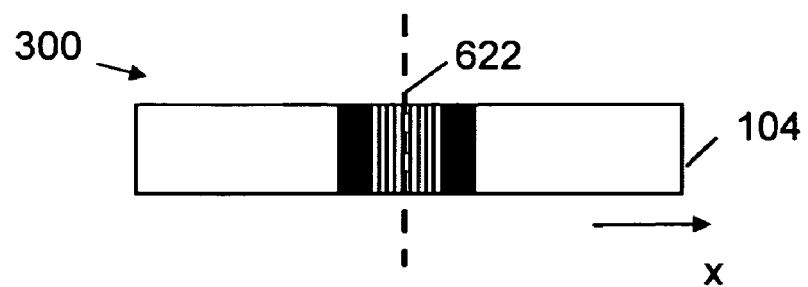
FIG. 7a-FIG. 7c illustrate the second step of a lithographic process according to a best mode embodiment of the invention.
Figure 7B:
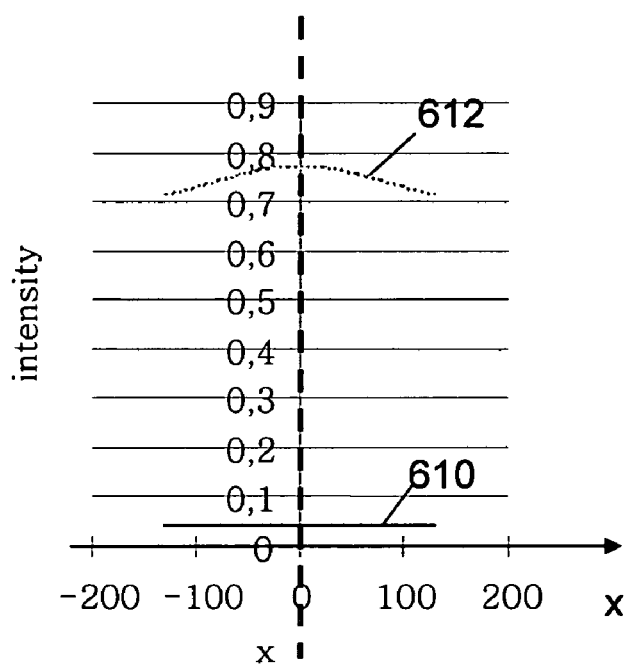
Figure 7C:
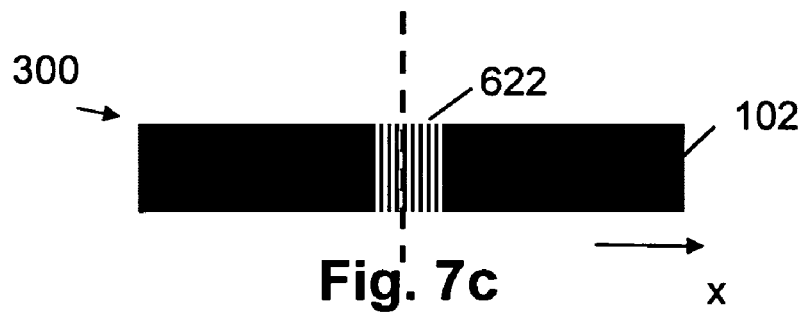

This second exposure step is illustrated by FIG. 7a to FIG. 7c. FIG. 7a shows the second mask 300, which has the inverse polarity of the original dark field (DF) mask 100 shown in FIG. 6a, whereby the pattern 602, e.g., the 9 lines of the grating has now become pattern 622, being 9 spacings and the light blocking layer 102 is removed from the transparent carrier 104. Likewise the original light field (LF) mask 100 shown in FIG. 6c is turned into a dark field version, shown in FIG. 7c, whereby the pattern 602, i.e., the 9 lines of the grating, has now become pattern 622, i.e., 9 spacings and the transparent carrier 104 is now covered by the opaque light blocking layer 104. The already exposed substrate 150 is then exposed to this second mask 300, i.e., correction mask 300.

FIG. 7b shows the intensity profile I along the x-axis, i.e., parallel to the second mask 300 and the exposed substrate 150, of the light transmitted through the second mask 300 and impinging on the layer to be patterned 142 (not shown). This intensity profile I is measured at the centre of the pattern 622 of the second mask 300, i.e., at the position of the middle spacing of the sequence of spacings, as indicated by the vertical dotted line of FIG. 7a, FIG. 7b and FIG. 7c. For the inverted DF mask 300 of FIG. 7a the focus $F_2$ and dose $E_2$ are chosen such that the intensity profile, shown as curve 612 (dotted line) of FIG. 7b is obtained. Due to the light field character of the inverted DF mask a high intensity profile is obtained. For the inverted LF mask 300 of FIG. 7c the focus $F_2$ and dose $E_2$ are chosen such that the intensity profile, shown as curve 610 (full line) of FIG. 7b is obtained. As a major part of the inverted mask 300 is covered with light blocking material 102, radiation will be blocked and a low intensity profile is obtained.

Figure 8A:
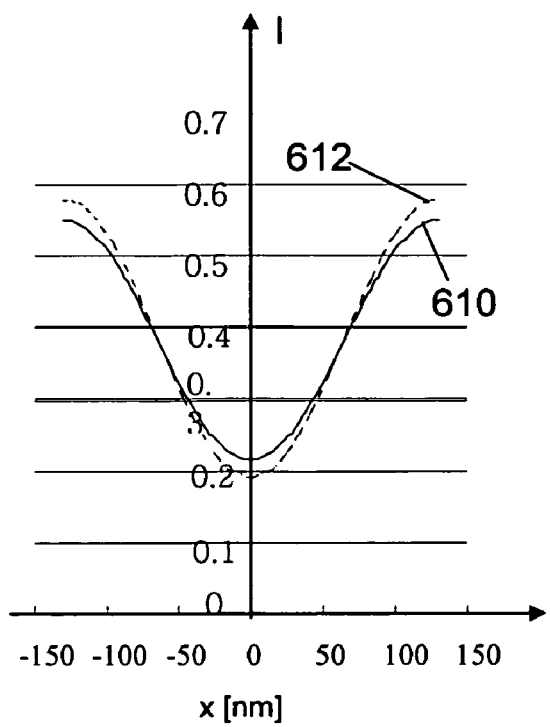
FIG. 8a-FIG. 8b illustrate the result of a lithographic process according to a best mode embodiment of the invention illustrated by FIGS. 6a-6d en 7a-7d.
Figure 8B:
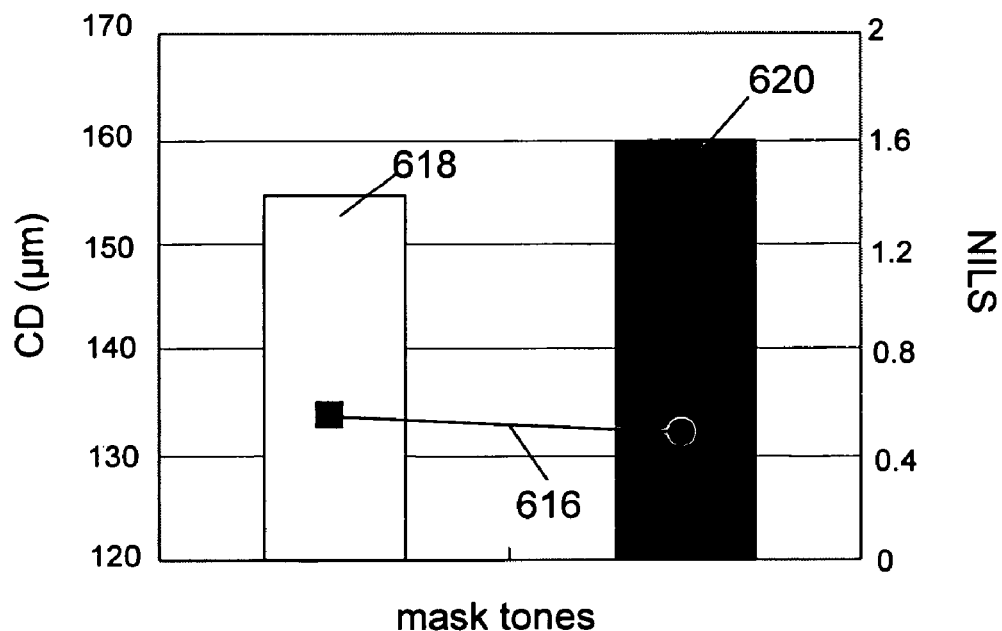

FIG. 8a and FIG. 8b shows the combined effect of the two exposures steps. FIG. 8a shows the intensity profile I resulting from the combination of the intensity profile I of FIG. 6b and of FIG. 7b. Compared to the intensity profile I of FIG. 6b, i.e., the profile before the corrective exposure, the intensity profile of the light field (LF) indicated by curve 610 and the intensity profile of the dark field (DF) indicated by curve 612 mask are now closer to each-other, indicating that the difference between both type of masks due to the stray light is cancelled out. As shown in FIG. 8b the mean value of the width (CD), indicated by curve 616, is about 135 nanometer (nm) (indicated by a square) with a NILS (Normalized Image Log slope), indicated by squares 618, 620, of about 1.4 for the light field (LF) version, indicated by square 618 with dotted pattern, while for the dark field (DF) version these numbers are respectively 132 nm (indicated by a circle) and 1.6, the NILS being indicated by square 620 with a line pattern. In the embodiment illustrated by FIG. 6a to FIG. 6d, FIG. 7a to FIG. 7c and FIG. 8a to FIG. 8b, the substrate 150 was first exposed with a first focus $F_1=0.0$ micrometer and a second dose $E_1$. For the second exposure the substrate 150 was exposed with a second focus $F_2=10.0$ micrometer and a second dose $E_2=0.6$ $E_1$.

Other arrangements for accomplishing the objectives of the method and system for optical lithography embodying the invention will be apparent for those skilled in the art. It is to be understood that although preferred embodiments, specific constructions and configurations, as well as materials, have been discussed herein for devices according to the present invention, various changes or modifications in form and detail may be made without departing from the scope and spirit of this invention. For example, the present invention also relates to the design of the masks as described and the use of such masks on lithographic tools such as, e.g., a stepper tool.

Another inventive aspect is a processing system for performing such a method of designing, wherein the method embodiments according to the present invention or part thereof are implemented. Such a processing system may include at least one programmable processor coupled to a memory subsystem that includes at least one form of memory, e.g., RAM, ROM, and so forth. A storage subsystem may be included that has at least one disk drive and/or CD-ROM drive and/or DVD drive. In some implementations, a display system, a keyboard, and a pointing device may be included as part of a user interface subsystem to provide for a user to manually input information. Ports for inputting and outputting data also may be included. More elements such as network connections, interfaces to various devices, and so forth, may be included. The various elements of the processing system may be coupled in various ways, including via a bus subsystem. The memory of the memory subsystem may at some time hold part or all of a set of instructions that when executed on the processing system implement the step(s) of the method embodiments of the present invention. Thus, while a processing system as such is prior art, a system that includes the instructions to implement aspects of the present invention is not prior art. Inventive aspects also includes a computer program product which provides the functionality of any of the methods according to the present invention when executed on a computing device. Further, inventive aspects include a data carrier such as for example a CD-ROM or a diskette which stores the computer product in a machine readable form and which executes at least one of the methods of the invention when executed on a computing device. Nowadays, such software is often offered on the Internet or a company Intranet for download, hence also included is transmitting the computer product according to inventive software over a local or wide area network.

The invention claimed is:

1. A lithographic method of providing a design on a substrate, the method comprising:
   irradiating according to the design a photosensitive layer covering the substrate with a first focus distance $F_1$, using at least one optical exposure; and
   correcting the irradiating by irradiating the photosensitive layer according to a correction mask having at least partly the negative image of the design with a second different focus distance $F_2$;
   wherein the negative image of the design comprises an inverted pattern of at least all features of the design having a dimension above a chosen threshold.

2. The method according to claim 1, wherein the chosen threshold is proportional to a defocus distance $F_2-F_1$.

3. The method according to claim 2, wherein the defocus distance is between 0.5 and 20 micrometers.

4. The method according to claim 3, wherein the defocus distance is between 1 and 5 micrometers.

5. The method according to claim 1, wherein irradiating substantially according to the design comprises irradiating according to the design completed with features for applying a resolution enhancement technique.

6. The method according to claim 1, wherein the correcting the irradiating by irradiating according to the correction mask is performed with an exposure dose $E_2$, and wherein the second focus distance $F_2$ and the exposure dose $E_2$ are determined using a Focus-Exposure-Matrix wafer experiment.

7. The method according to claim 1, wherein the irradiating substantially according to the design is performed using a first irradiation source, the correcting the irradiating by irradiating according to the correction mask is performed using a second irradiation source, and wherein the first irradiation source has a wavelength smaller than the second irradiation source.

8. The method according to claim 1, wherein the correcting the irradiating by irradiating according to the correction mask comprises multiple exposure steps.

9. The method according to claim 8, wherein each of the multiple exposure steps is performed with a focus distance different from a focus distance used during the irradiating substantially according to the design.

10. A lithographic method of providing a design on a substrate, the method comprising:

irradiating according to the design in a first irradiation step a photosensitive layer covering the substrate with a first focus distance $F_1$, using at least one optical exposure; and correcting the irradiating by irradiating in a second irradiation step the photosensitive layer according to a correction mask having at least partly the negative image of the design with a second different focus distance $F_2$;

wherein the negative image of the design comprises an inverted pattern of at least all features of the design having a dimension above a chosen threshold.

* * * * *